United States Patent
van de Gevel et al.

(10) Patent No.: US 12,445,115 B2
(45) Date of Patent: Oct. 14, 2025

(54) LOW-PASS FILTER CIRCUIT

(71) Applicant: NXP B.V., Eindhoven (NL)

(72) Inventors: Marcel van de Gevel, Haarlem (NL); Federico Bruccoleri, Pijnacker (NL); Mark Stoopman, Capelle aan den ijssel (NL); Koen van Hartingsveldt, Leiderdorp (NL)

(73) Assignee: NXP B.V., Eindhoven (NL)

( * ) Notice: Subject to any disclaimer, the term of this patent is extended or adjusted under 35 U.S.C. 154(b) by 91 days.

(21) Appl. No.: 18/491,846

(22) Filed: Oct. 23, 2023

(65) Prior Publication Data
US 2024/0171154 A1 May 23, 2024

(30) Foreign Application Priority Data
Nov. 17, 2022 (EP) .................................. 22208038

(51) Int. Cl.
*H03H 11/04* (2006.01)
*H03H 7/075* (2006.01)

(52) U.S. Cl.
CPC ........ *H03H 11/0422* (2013.01); *H03H 7/075* (2013.01); *H03H 2011/0488* (2013.01)

(58) Field of Classification Search
CPC ................................ H03H 7/06; H03H 7/065
See application file for complete search history.

(56) References Cited

U.S. PATENT DOCUMENTS

| | | | |
|---|---|---|---|
| 1,450,080 A | 3/1923 | Hazeltine | |
| 10,097,153 B1 * | 10/2018 | Rowland | .............. H03H 7/0115 |
| 10,348,250 B2 * | 7/2019 | Dempsey | ................. H03F 1/42 |
| 10,447,206 B2 * | 10/2019 | Lee | ......................... H03F 3/195 |
| 10,483,947 B2 | 11/2019 | Lo et al. | |
| 2015/0288392 A1 | 10/2015 | Floyd et al. | |
| 2019/0207573 A1 | 7/2019 | Stanescu et al. | |

FOREIGN PATENT DOCUMENTS

| | | |
|---|---|---|
| JP | 2001267886 A1 | 9/2001 |
| WO | 0150599 A2 | 7/2001 |

OTHER PUBLICATIONS

Harris, G.R., "Bridged Reactance-Resistance Networks", Proceeding of the I.R.E., vol. 37, Issue 8, Aug. 1949.
Ritter, R., "Anti-Aliasing Filter Improvement in Continuous-Time Feedback Sigma-Delta Modulators", 2015 IEEE International Symposium on Circuits and Systems (ISCAS), May 24-27, 2015.
(Continued)

*Primary Examiner* — Jeffrey S Zweizig (57) ABSTRACT

A low-pass filter circuit comprising: a low-pass filter input terminal; a low-pass filter output terminal; a reference terminal; at least three filter resistors connected in series with each other between the low-pass filter input terminal and the low-pass filter output terminal, such that there is a resistor-connecting-node between each adjacent pair of filter resistors; a plurality of filter capacitors, one for each of the resistor-connecting-nodes, wherein each of the filter capacitors is connected between an associated resistor-connecting-node and the reference terminal; and a branch connected in parallel with the at least three filter resistors, wherein the branch comprises a bridging capacitor and a bridging resistor in series with each other.

19 Claims, 9 Drawing Sheets

(56) References Cited

OTHER PUBLICATIONS

Scott, H.H., "A New Type of Selective Circuit and Some Applications", of the Institute of Radio Engineers, vol. 26, Issue 2, Feb. 1938.
Van De Gevel, M., "Low-Power MOS Integrated Filter with Transconductors with Spoilt Current Sources", IEEE Journal of Solid-State Circuits, vol. 32, No. 10, Oct. 1997.

* cited by examiner

LOW-PASS FILTER CIRCUIT

CROSS-REFERENCE TO RELATED APPLICATIONS

This application claims the priority under 35 U.S.C. § 119 of European Patent application no. 22208038.4, filed on 17 Nov. 2022, the contents of which are incorporated by reference herein.

FIELD

The present disclosure relates to a low-pass filter circuit, and in particular to a low-pass filter that can also provide the functionality of a notch.

SUMMARY

According to a first aspect of the present disclosure there is provided a low-pass filter circuit comprising:
- a low-pass filter input terminal;
- a low-pass filter output terminal;
- a reference terminal;
- at least three filter resistors connected in series with each other between the low-pass filter input terminal and the low-pass filter output terminal, such that there is a resistor-connecting-node between each adjacent pair of filter resistors;
- a plurality of filter capacitors, one for each of the resistor-connecting-nodes, wherein each of the filter capacitors is connected between an associated resistor-connecting-node and the reference terminal; and
- a branch connected in parallel with the at least three filter resistors, wherein the branch comprises a bridging capacitor and a bridging resistor in series with each other.

Advantageously, the bridging resistor improves the asymptotic roll-off of the filter which improves the achievable alias suppression, particularly that of the first alias.

In one or more embodiments the low-pass filter circuit further comprises an input capacitor connected between the low-pass filter input terminal and the reference terminal.

In one or more embodiments the low-pass filter circuit further comprises an output capacitor connected between the low-pass filter output terminal and the reference terminal.

In one or more embodiments one or more of the filter capacitors comprises a variable capacitor.

In one or more embodiments one or more of the filter capacitors comprises a switchable capacitor bank.

In one or more embodiments the low-pass filter circuit further comprises a controller configured to set the capacitance of the one or more switchable capacitor banks based on a desired notch frequency of the circuit.

In one or more embodiments the branch comprises:
- a bridging-connection-node between the series connection of the bridging capacitor and the bridging resistor; and
- a tuning resistor connected between the bridging-connection-node and the reference terminal, wherein the tuning resistor is a variable resistor.

In one or more embodiments the tuning resistor comprises a switchable resistor bank.

In one or more embodiments the low-pass filter circuit further comprises a controller configured to provide a control signal for setting the resistance of the tuning resistor based on a desired notch frequency of the circuit.

There is also disclosed a filter circuit comprising:
- a filter circuit input terminal;
- a filter circuit intermediate node;
- a filter circuit output terminal;
- a reference terminal;
- any low-pass filter circuit disclosed herein, wherein:
    - the low-pass filter input terminal is connected to the filter circuit input terminal; and
    - the low-pass filter output terminal is connected to the filter circuit intermediate node; and
- a feedback stage, wherein the feedback stage comprises:
    - a feedback stage input terminal, which is connected to the filter circuit intermediate node;
    - a feedback stage output terminal, which is connected to the filter circuit output terminal;
    - a feedback stage input resistor comprising a first terminal and a second terminal, wherein the first terminal is connected to the feedback stage input terminal;
    - an inverting amplifier having an input terminal and an output terminal, wherein:
        - the input terminal of the inverting amplifier is connected to the second terminal of the feedback stage input resistor; and
        - the output terminal of the inverting amplifier is connected to the feedback stage output terminal;
    - a feedback capacitor connected between the output terminal of the inverting amplifier and the input terminal of the inverting amplifier; and
    - a feedback resistor connected between the output terminal of the inverting amplifier and the feedback stage input terminal.

In one or more embodiments:
the feedback capacitor of the filter circuit comprises a first plate and a second plate, wherein the first plate is connected to the input terminal of the inverting amplifier;
the feedback stage further comprises:
- an additional feedback capacitor having a first plate and a second plate, wherein:
    - the first plate of the additional feedback capacitor is connected to the second plate of the feedback capacitor; and
    - the second plate of the additional feedback capacitor is connected to the output terminal of the inverting amplifier; and
- a variable feedback capacitor, connected between: i) a node between the feedback capacitor and the additional feedback capacitor; and ii) the reference terminal.

In one or more embodiments the variable feedback capacitor of the filter circuit comprises a switchable capacitor bank.

In one or more embodiments the filter circuit further comprises:
- a transconductance amplifier that is configured to provide signalling to the filter circuit input terminal to drive the low-pass filter; and
- optionally the transconductance amplifier has a transconductance that is inversely proportional to the resistance of the at least three filter resistors.

There is also disclosed a differential circuit comprising:
- a first differential low-pass filter input terminal;
- a second differential low-pass filter input terminal;
- a first differential low-pass filter output terminal;
- a second differential low-pass filter output terminal;
- a first differential low-pass filter circuit comprising any low-pass filter circuit disclosed herein, wherein:

the low-pass filter input terminal of the first differential low-pass filter circuit is connected to the first differential low-pass filter input terminal; and the low-pass filter output terminal of the first differential low-pass filter circuit is connected to the first differential low-pass filter output terminal;

a second differential low-pass filter circuit comprising any low-pass filter circuit disclosed herein, wherein:

the low-pass filter input terminal of the second differential low-pass filter circuit is connected to the second differential low-pass filter input terminal; and the low-pass filter output terminal of the second differential low-pass filter circuit is connected to the second differential low-pass filter output terminal.

In one or more embodiments the differential circuit further comprises:

a first differential output terminal;

a second differential output terminal;

a first feedback stage, wherein the first feedback stage comprises:

a first feedback stage input terminal, which is connected to the first differential low-pass filter output terminal;

a first feedback stage output terminal, which is connected to the first differential output terminal;

a first feedback stage input resistor comprising a first terminal and a second terminal, wherein the first terminal is connected to the first feedback stage input terminal;

a first inverting amplifier having an input terminal and an output terminal, wherein:

the input terminal of the first inverting amplifier is connected to second terminal of the first feedback stage input resistor; and the output terminal of the first inverting amplifier is connected to the first feedback stage output terminal;

a first feedback capacitor connected between the output terminal of the first inverting amplifier and the input terminal of the first inverting amplifier; and a first feedback resistor connected between the output terminal of the first inverting amplifier and the first feedback stage input terminal; and a second feedback stage, wherein the second feedback stage comprises:

a second feedback stage input terminal, which is connected to the second differential low-pass filter output terminal;

a second feedback stage output terminal, which is connected to the second differential output terminal;

a second feedback stage input resistor comprising a first terminal and a second terminal, wherein the first terminal is connected to the second feedback stage input terminal;

a second inverting amplifier having an input terminal and an output terminal, wherein:

the input terminal of the second inverting amplifier is connected to second terminal of the second feedback stage input resistor; and the output terminal of the second inverting amplifier is connected to the second feedback stage output terminal;

a second feedback capacitor connected between the output terminal of the second inverting amplifier and the input terminal of the second inverting amplifier; and a second feedback resistor connected between the output terminal of the second inverting amplifier and the second feedback stage input terminal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

The present disclosure relates to a filter that can adequately suppress aliases of an analogue to digital converter (ADC) without requiring too much power, and in particular to an anti-alias filter that consumes less power than conventional on-chip anti-alias filters. Such an anti-alias filter can be implemented as a low-pass filter. Examples disclosed herein can be particularly well-suited to a Bluetooth receiver circuit.

On-chip anti-alias filters can be designed by first choosing a transfer function with some desirable characteristics and then implementing it with a combination of resistors, capacitors and amplifiers. The number of amplifiers and, as a result, the supply current is likely to be greater than would be the case if the filter were implemented with a predominantly passive filter and the transfer function were tailored to what can be made with such a filter.

In order to minimize the supply current of a filter, it is advantageous to make it completely or predominantly passive. However, a chain of passive RC (resistor-capacitor) filters has a very smooth roll-off, which can limit the achievable alias suppression, particularly the first alias. The higher aliases can be better suppressed than the first alias because the filter transfer function typically keeps decreasing with frequency. Adding a notch can help to improve the suppression of the first alias.

A passive RC notch filter can be implemented as a bridged-T filter and a twin-T filter. A notch filter is an example of a band-stop filter. A bridged-T filter can consist of an RCR (resistor-capacitor-resistor) first-order low-pass section, which is bridged by a capacitor. As the phase shifts of the two paths never differ by 180°, complete cancellation is impossible, which limits the notch depth.

Figure 1:
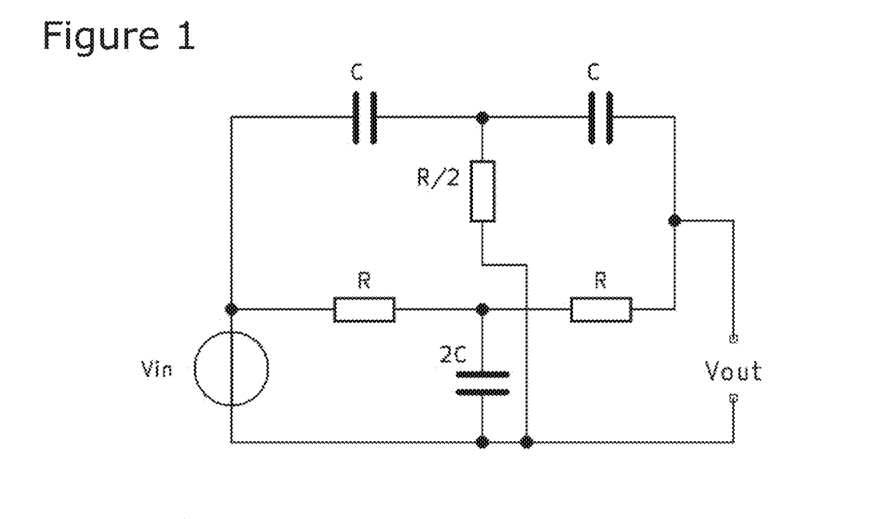
FIG. 1 shows a twin-T notch filter.

FIG. 1 shows a twin-T notch filter, which addresses the limitations with notch depth associated with a bridged-T filter. The twin-T notch filter of FIG. 1 has a first-order low-pass path and a second-order high-pass path. At a notch frequency, these paths are 180° out of phase and equal in amplitude, resulting in 0 total transfer. The transfer goes to unity for zero frequency and for frequencies approaching infinity, which is as expected because the twin-T is a notch filter. This functionality is a disadvantage for an anti-alias filter, however, because the anti-alias filter should provide the functionality of a low-pass filter, not a pure notch filter.

Figure 2:
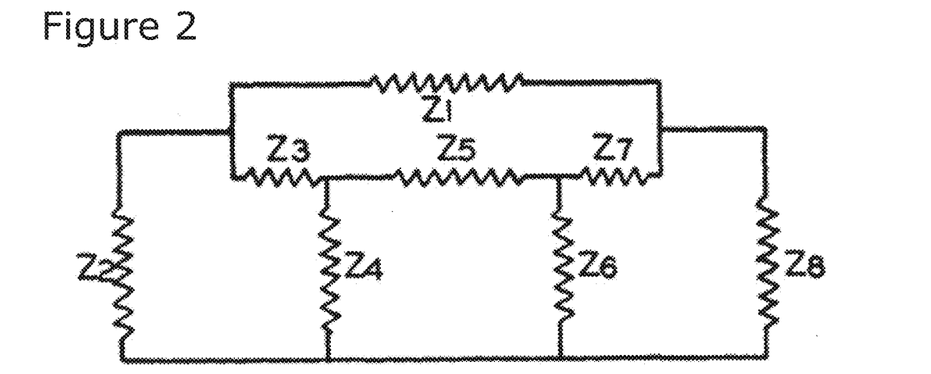
FIG. 2 shows a generalised illustration of a bridged RC ladder filter.

FIG. 2 shows a generalised illustration of a bridged RC ladder filter. It can be implemented as an RC ladder filter bridged by an impedance (Z1).

Figure 3:
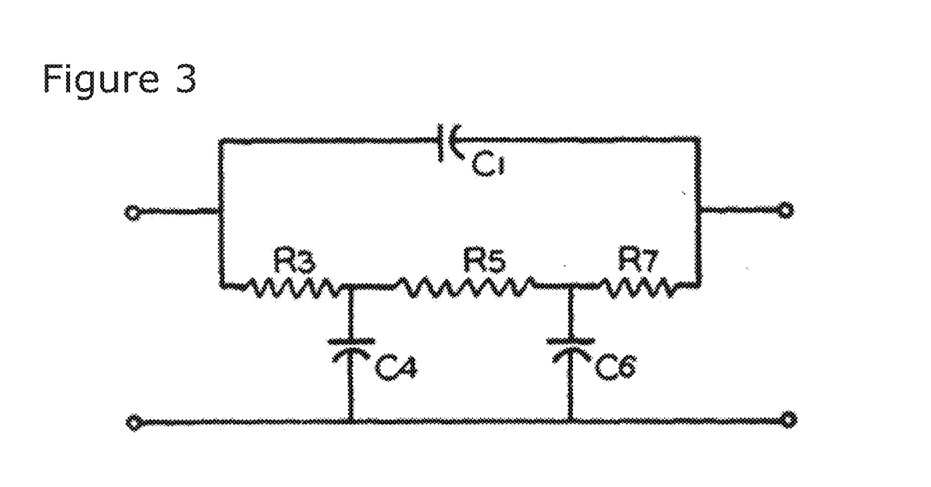
FIG. 3 shows another illustration of bridged RC ladder filter.

FIG. 3 shows another illustration of bridged RC ladder filter. It consists of an RCRCR ladder filter bridged with a capacitor (C1)

One or more examples of the present disclosure that are described below can be considered as a filter that is a variant of the bridged RC ladder filters of FIGS. 2 and 3. Examples of the proposed filter can achieve 180° of phase difference by bridging two RC low-pass sections in a chain of RC low-pass sections with an extra branch. The low-pass behaviour is preserved in such a filter, although the asymptotic slope is necessarily reduced compared to a non-bridged filter; it is improved compared to the circuit of FIG. 3, however.

Therefore, such examples can be considered as a low-pass filter with a notch. Furthermore, they can have improved tunability and improved asymptotic roll-off.

Figure 4:
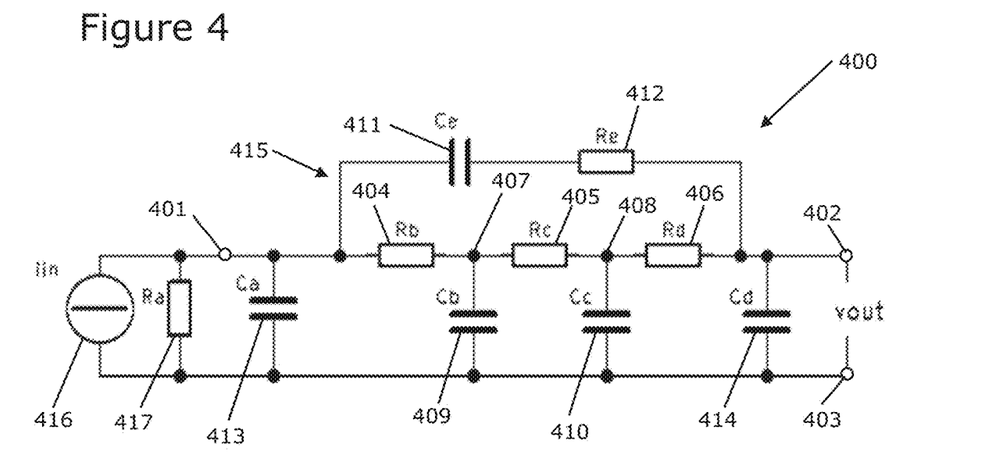
FIG. 4 shows an example embodiment of a low-pass filter circuit according to the present disclosure.

FIG. 4 shows an example embodiment of a low-pass filter circuit 400 according to the present disclosure.

The low-pass filter circuit 400 includes a low-pass filter input terminal 401, a low-pass filter output terminal 402 and a reference terminal 403. In this example, the reference terminal 403 is ground.

The low-pass filter circuit 400 includes three filter resistors 404, 405, 406 (Rb-Rd) in this example. The three filter resistors 404, 405, 406 (Rb-Rd) are connected in series with each other between the low-pass filter input terminal 401 and the low-pass filter output terminal 402. In other examples, the low-pass filter circuit may include more than three filter resistors in series with each other between the low-pass filter input terminal 401 and the low-pass filter output terminal 402. As shown in FIG. 4, there is a resistor-connecting-node 407, 408 between each adjacent pair of filter resistors 404, 405, 406 (Rb-Rd). More specifically, there is: i) a first resistor-connecting-node 407 between a first filter resistor 404 (Rb) and a second filter resistor 405 (Rc); and ii) a second resistor-connecting-node 408 between the second filter resistor 405 (Rc) and a third filter resistor 406 (Rd).

The low-pass filter circuit 400 also includes a plurality of filter capacitors 409, 410 (Cb, Cc), one for each of the resistor-connecting-nodes 407, 408. Each of the filter capacitors 409, 410 (Cb, Cc) is connected between an associated resistor-connecting-node 407, 408 and the reference terminal 403. More specifically: i) a first filter capacitor 409 (Cb) is connected between the first resistor-connecting-node 407 and the reference terminal 403; and ii) a second filter capacitor 410 (Cc) is connected between the second resistor-connecting-node 408 and the reference terminal 403.

The low-pass filter circuit 400 also includes a branch 415 connected in parallel with the at least three filter resistors 404, 405, 406 (Rb-Rd). The branch 415 includes a bridging capacitor 411 (Ce) and a bridging resistor 412 (Re) in series with each other. Including a resistor and a capacitor in the branch 415 enables the low-pass filter circuit 400 of FIG. 4 to function as a low-pass filter with a notch, which represents an improvement over the circuit of FIG. 3. The inclusion of the bridging resistor 412 (Re) can improve the asymptotic roll-off.

Network analysis shows that the transfer function of the low-pass filter circuit 400 is zero at a radian frequency $\omega_z$ when the following two conditions are met:

$$R_e = \omega_z^2 R_b R_c R_d C_b C_c - R_b - R_c - R_d \quad (1)$$

and $$C_e = \frac{1}{\omega_z^2 (R_b R_c C_b + R_b R_d C_b + R_b R_d C_c + R_c R_d C_c)} \quad (2)$$

That is, (1) and (2) show how to dimension the components in the branch 415 ($R_e$-$C_e$) such that a notch can be provided at a desired radian frequency $\omega_z$.

The low-pass filter circuit 400 of FIG. 4 also includes an input capacitor 413 (Ca) and an output capacitor 414 (Cd). The input capacitor 413 (Ca) is connected between the low-pass filter input terminal 401 and the reference terminal 403. The output capacitor 414 (Cd) is connected between the low-pass filter output terminal 402 and the reference terminal 403. While having only one of the input and the output capacitors 413 (Ca) and 414 (Cd) in the circuit would suffice to get asymptotic roll-off for frequencies well above the notch frequency, having them both, along with the bridging resistor 412 (Re) in the circuit increases the roll-off from first to second order.

In FIG. 4, the input signalling to the low-pass filter circuit 400 is modelled as: i) a current source 416 (iin) that is connected between the low-pass filter input terminal 401 and the reference terminal 403; and ii) a source resistor 417 (Ra) that is connected between the low-pass filter input terminal 401 and the reference terminal 403.

Figure 5:
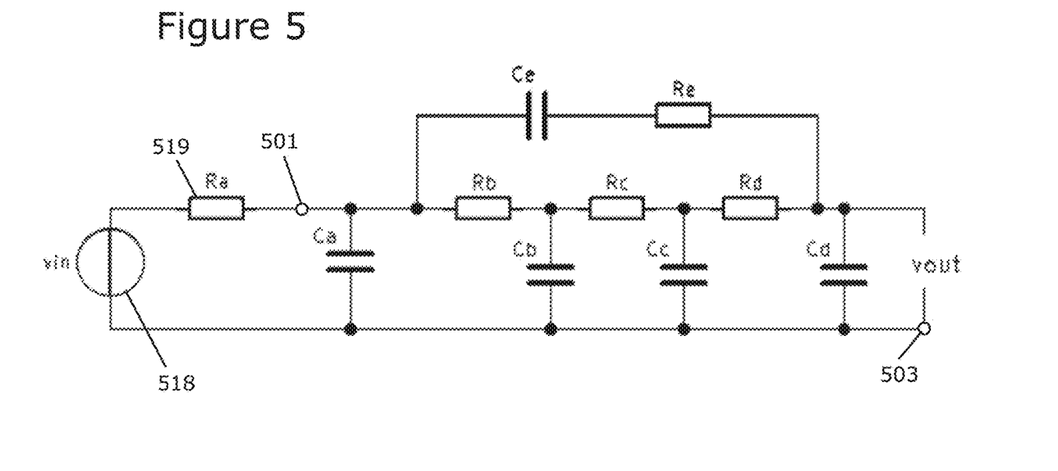
FIG. 5 shows an alternative schematic view of the low-pass filter circuit of FIG. 4.

FIG. 5 shows an alternative schematic view of the low-pass filter circuit of FIG. 4. The only difference between the schematic views of FIGS. 4 and 5 is the way in which the input signalling is represented. In FIG. 5, the input signalling is modelled as: i) a voltage source 518 (vin) that is connected between the low-pass filter input terminal 501 and the reference terminal 503; and ii) a source resistor 519 (Ra) that is connected in series between the voltage source 518 (vin) and the low-pass filter input terminal 501.

It will be appreciated that the schematics in FIGS. 4 and 5 are equivalent; the only difference is a Norton-Thévenin transformation of the source.

The low-pass filter circuits of FIG. 4 or 5 can be implemented on an integrated circuit (IC). However, integrated resistors and capacitors can be fairly inaccurate. Therefore, advantageously, the following examples provide a tuning mechanism in order to tune the low-pass filter circuit to the correct frequency.

It has been found that small inaccuracies of the filter impedance only cause small gain errors, which don't affect the overall performance of the low-pass filter circuit too much. Therefore, it is acceptable in some applications to either assume that the resistance values for all of the resistors are correct, or at least close enough such they do not require tuning, and only tune the capacitors, or to assume that all capacitance values are correct and only tune the resistors. In any case, the tuning range should be large enough to set the time constants at their intended values, and so should be large enough to cover the tolerances of the RC products. In fact, it has been found that trimming/tuning the capacitance-related terms and not the resistance-related terms makes the gain more accurate if the low-pass filter circuit is driven by a transconductance amplifier with a transconductance that is inversely proportional to the resistance of the (on-chip) resistors (such as the at least three filter resistors 404, 405, 406 (Rb-Rd)).

Therefore, one or more of the filter capacitors 409, 410 (Cb, Cc) can be provided as a variable capacitor, in some examples as a switchable capacitor bank. Also, the bridging capacitor 411 (Ce) can be provided as a variable capacitor, in some examples as a switchable capacitor bank.

The switchable capacitor banks can include switches that are implemented as MOSFETS (metal oxide semiconductor field effect transistors). It can be advantageous if such switching MOSFETs are connected to ground or to some fixed DC level on one side. In this way, their on-resistance doesn't get modulated by the signal. Furthermore, it allows filter operation at a lower supply voltage.

In FIGS. 4 and 5, the filter capacitors 409, 410 (Cb, Cc) are connected to the reference terminal 403 (e.g. grounded) on one side. Therefore, these capacitors can straightforwardly be replaced with a switchable capacitor bank. Such a switchable capacitor bank can be provided as a plurality of capacitors in parallel with each other, each of which is smaller than the required overall capacitance of the associated filter capacitor 409, 410 (Cb, Cc), that are selectively switched into the circuit on the basis of a control signal. The control signal can be provided by a controller (not shown in the drawings).

However, neither of the plates of the bridging capacitor 411 (Ce) are connected to the reference terminal or any other node with a fixed DC voltage level. Therefore, the tunability of the low-pass filter circuits of FIGS. 4 and 5 can be improved by providing the functionality of a variable bridging capacitor 411 (Ce) in a different way.

Figure 6:
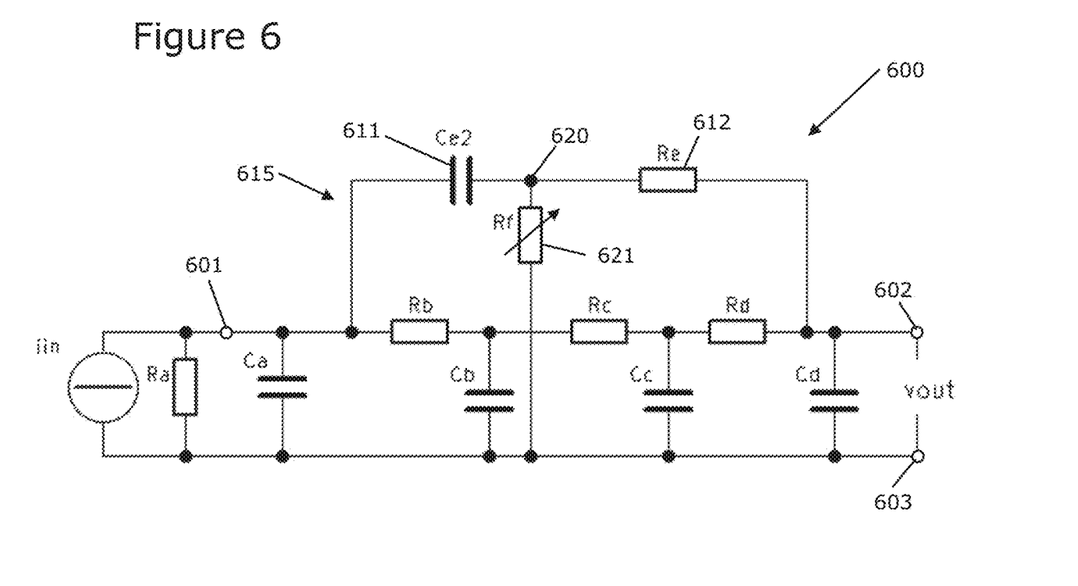
FIG. 6 shows another example embodiment of a low-pass filter circuit according to the present disclosure.

FIG. 6 shows another example embodiment of a low-pass filter circuit 600 according to the present disclosure. Features and components of FIG. 6 that are also shown in FIG. 4 are given corresponding reference numbers in the 600 series and will not necessarily be described again here.

In FIG. 6, the branch 615 includes a bridging capacitor 611 (Ce2), a bridging resistor 612 (Re) and a variable tuning resistor 621 (Rf).

The bridging capacitor 611 (Ce2) in FIG. 6 has a capacitance value that is greater than the capacitor value of the corresponding bridging capacitor (Ce) in FIG. 4. The capacitance value of the bridging capacitor 611 (Ce2) in FIG. 6 can be greater than the capacitor value of the corresponding bridging capacitor (Ce) in FIG. 4 by at least a factor that is expected to be needed to trim out the combination of the tolerances in the component values that affect the time constant of the low-pass filter circuit 600.

The bridging capacitor 611 (Ce2) is followed by a resistive current divider, which is provided by the bridging resistor 612 (Re) (which can have the nominal resistance given by equation (1)) and the variable tuning resistor 621 (Rf).

A bridging-connection-node 620 is between the series connection of the bridging capacitor 611 (Ce2) and the bridging resistor 612 (Re). The variable tuning resistor 621 (Rf) is connected between the bridging-connection-node 620 and the reference terminal 603. As will be discussed below, surprisingly it has been found that changing the value of the variable tuning resistor 621 (Rf) also tunes the effective capacitive term that is provided by the bridging capacitor 611 (Ce2). Or, more precisely, the capacitive term of the reciprocal of the transadmittance of the bridging network 615 is tuned by changing the resistance value of the variable tuning resistor 621 (Rf).

The variable tuning resistor 621 (Rf) can be implemented as a switchable resistor bank, which is connected to the reference terminal 603 in this example (e.g. ground). In other examples it could be connected to any fixed bias voltage. The resistance value of such a switchable resistor bank can be changed during tuning, which can be performed by operating switches that are connected at one of their sides to a fixed bias voltage (the reference terminal 603 in this example). A controller (not shown) can provide a control signal for setting the resistance of the variable tuning resistor 621 (Rf) based on a desired notch frequency of the circuit. (Such a controller can also provide control signals to any of the variable components described herein to set their component values based on a desired notch frequency of the circuit.) Therefore, the advantage that is identified above of providing switching MOSFETs that have one terminal connected to a fixed bias voltage are achieved for the circuit of FIG. 6, while still enabling the effective capacitance value of the branch 615 to be tuned.

It is clear from inspection of the branch 615 in the low-pass filter circuit 600 of FIG. 6 that its transadmittance approaches $1/R_e$ for $s \to \infty$. It is also clear that the transadmittance approaches $SC_{e2}R_f/(R_e+R_f)$ for $s \to 0$. Therefore, it can be seen that the resistive current division (that is provided by the bridging resistor 612 (Re) and the variable tuning resistor 621 (Rf)) has an effect on the capacitive term and not on the resistive term. This is confirmed by writing out the network equations:

$$I_{out} = \frac{R_f}{R_e + R_f} \cdot \frac{V_{in}}{\frac{R_e R_f}{R_e + R_f} + \frac{1}{sC_{e2}}} = V_{in} \cdot \frac{R_f sC_{e2}}{R_e R_f sC_{e2} + R_e + R_f} \quad (3)$$

$$\frac{V_{in}}{I_{out}} = R_e + \frac{R_e + R_f}{R_f} \cdot \frac{1}{sC_{e2}} \quad (4)$$

In these equations, $V_{in}$ is the voltage between the low-pass filter input terminal 601 and the reference terminal 603, and $I_{out}$ is the current through the bridging resistor 612 (Re). Equation (4) shows that the reciprocal of the transadmittance is the same as that of a simple RC series network with resistance $R_e$ and capacitance $C_{e2}R_f/(R_e+R_f)$.

Figure 7:
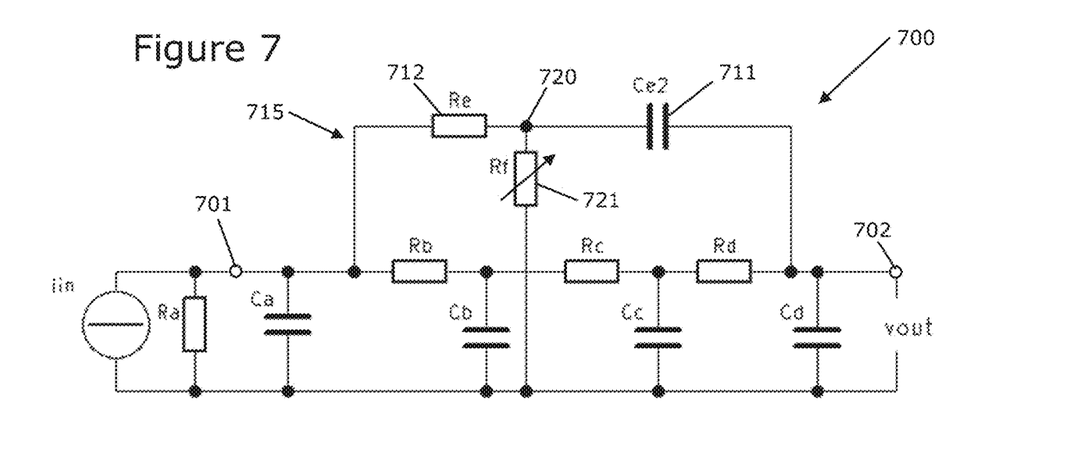
FIG. 7 shows another example embodiment of a low-pass filter circuit according to the present disclosure.

FIG. 7 shows another example embodiment of a low-pass filter circuit 700 according to the present disclosure, which is very similar to the circuit of FIG. 6. Features and components of FIG. 7 that are also shown in FIG. 6 are given corresponding reference numbers in the 700 series.

In FIG. 7, the series connection of the bridging capacitor 711 (Ce2) and the bridging resistor 712 (Re) in the branch 715 have been reversed.

In FIG. 7:
the bridging resistor 712 (Re) has a first terminal and a second terminal, wherein the first terminal is connected to the low-pass filter input terminal 701, and wherein the second terminal is connected to the bridging-connection-node 720; and
the bridging capacitor 711 (Ce2) has a first plate and a second plate, wherein the first plate is connected to the bridging-connection-node 720, and the second plate is connected to the low-pass filter output terminal 702.

This is in contrast to FIG. 6, in which:
the bridging capacitor 611 (Ce2) has a first plate and a second plate, wherein the first plate is connected to the low-pass filter input terminal 601, and wherein the second plate is connected to the bridging-connection-node 620; and
the bridging resistor 612 (Re) has a first terminal and a second terminal, wherein the first terminal is connected to the bridging-connection-node 620, and the second terminal is connected to the low-pass filter output terminal 602.

The roll-off in the pass-band that is typical of cascaded RC sections can be reduced by adding one peaking filter stage, for example a multiple feedback stage at the output. This leads to FIG. 8.

Figure 8:
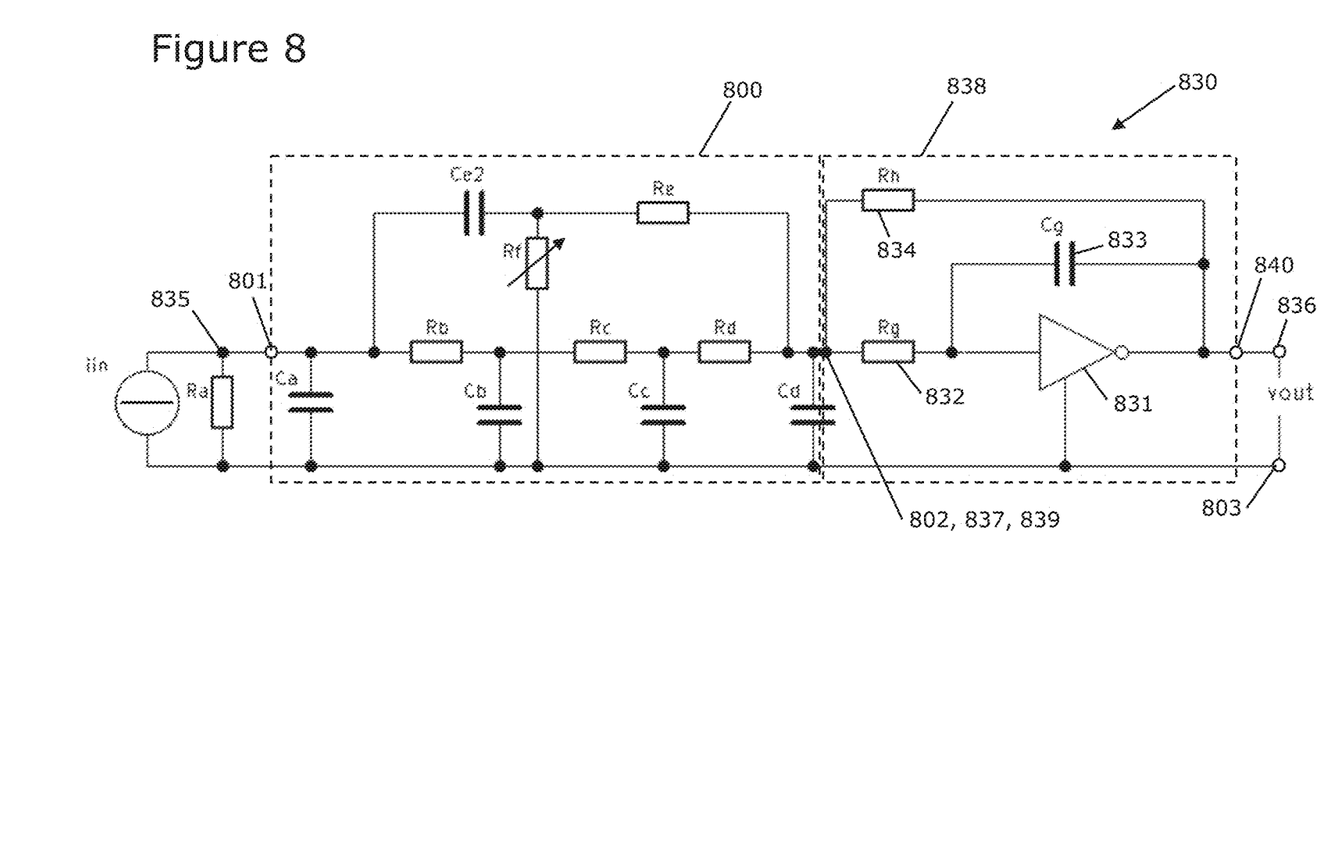
FIG. 8 shows an example embodiment of a filter circuit according to the present disclosure.

FIG. 8 shows an example embodiment of a filter circuit 830 according to the present disclosure.

The filter circuit 830 has a filter circuit input terminal 835, a filter circuit output terminal 836 and a reference terminal 803.

The filter circuit 830 also includes a low-pass filter circuit 800, which can be any of the low-pass filter circuits that are described herein. In this example, the low-pass filter circuit of FIG. 8 is the same as the one that is illustrated in FIG. 6. The low-pass filter circuit 800 has a low-pass filter input terminal 801, which is connected to the filter circuit input terminal 835. The low-pass filter circuit 800 also has a low-pass filter output terminal 802 that is connected to a filter circuit intermediate node 837.

In this example, the filter circuit 830 also includes a feedback stage 838. This is an example of a peaking filter stage at the output, which can improve the roll-off in the pass-band. The feedback stage 838 has a feedback stage input terminal 839, which is connected to the filter circuit intermediate node 837. The feedback stage 838 also has a feedback stage output terminal 840, which is connected to the filter circuit output terminal 836.

The feedback stage 838 includes an inverting amplifier 831, a feedback stage input resistor 832 (Rg), a feedback capacitor 833 (Cg) and a feedback resistor 834 (Rh). The feedback stage input resistor 832 (Rg) has a first terminal and a second terminal, wherein the first terminal is connected to the feedback stage input terminal 839. The inverting amplifier 831 has an input terminal and an output terminal. The input terminal of the inverting amplifier 831 is connected to the second terminal of the feedback stage input resistor 832 (Rg). The output terminal of the inverting amplifier 831 is connected to the feedback stage output terminal 840. The feedback capacitor 833 (Cg) is connected between the output terminal of the inverting amplifier 831 and the input terminal of the inverting amplifier 831. That is, the feedback capacitor 833 (Cg) has: a first plate that is connected to the input terminal of the inverting amplifier 831; and a second plate that is connected to the output terminal of the inverting amplifier 831 The feedback resistor 834 (Rh) is connected between the output terminal of the inverting amplifier 831 and the feedback stage input terminal 839.

The feedback capacitor 833 (Cg) can be provided as a variable capacitor in some examples, in order to improve the tunability of the filter circuit 830 in the same way that is discussed above. This can be beneficial in some applications, although in other examples the precision of the capacitance value of the feedback capacitor 833 (Cg) may not have a significant impact on the performance of the filter circuit 830. This is because the feedback capacitor 833 (Cg) is not part of the circuitry that creates the notch. If the feedback capacitor 833 (Cg) is to be implemented as a switched capacitor bank, then there can be an advantage to using an implementation in which one of the terminals is connected to a fixed DC voltage for the reasons that are identified above.

Including a peaking multiple-feedback stage 838 at the output of the low-pass filter circuit 800 can advantageously reduce in-band roll-off, and can act as a buffer to drive the load (for example an ADC input). Although it is not shown in the drawings, it will be readily appreciated that the signal source can be replaced with a Thévenin equivalent (as it can be for any of the schematics that are illustrated). The low-pass filter circuit can be made differential (as will be described below) and the bridging capacitor (Ce2) and the bridging resistor (Re) can be swapped.

Figure 9:
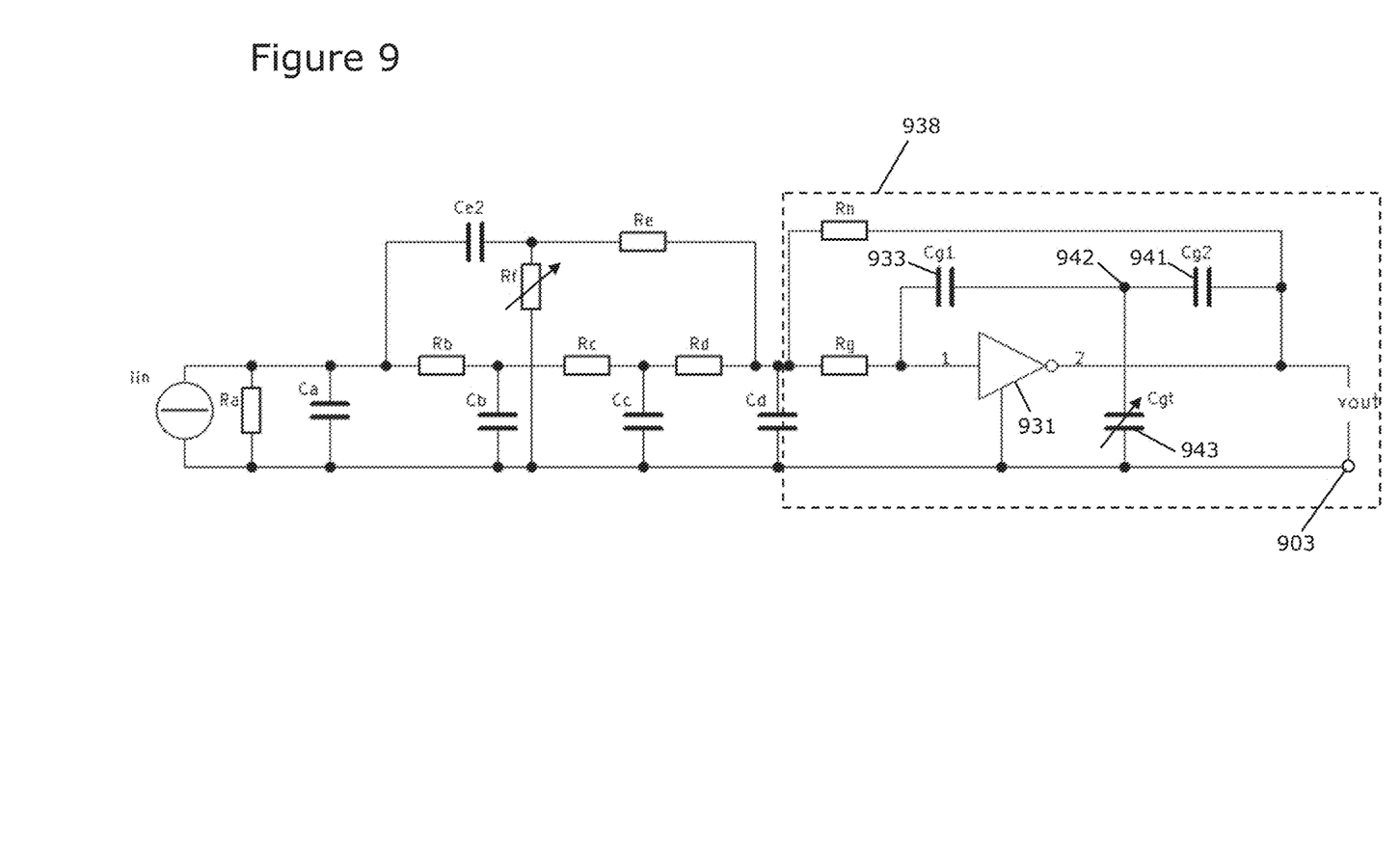
FIG. 9 shows another example embodiment of a filter circuit according to the present disclosure.

FIG. 9 shows another example embodiment of a filter circuit 930 according to the present disclosure, which is similar to the filter circuit of FIG. 8. Features of Figure that are also shown in FIG. 9 have been given corresponding reference numbers in the 900 series. As will be discussed below, in FIG. 9 the functionality of the feedback capacitor (Cg) of FIG. 8 is implemented in such a way that it can be tuned using switches to ground, which is again attractive to enable filter operation at a low supply voltage.

In FIG. 9, the feedback stage 938 includes a feedback capacitor 933 (Cg1), an additional feedback capacitor 941 (Cg2) and a variable feedback capacitor 943 (Cgt).

The feedback capacitor 933 (Cg1) has a first plate and a second plate. The additional feedback capacitor (Cg2) also has a first plate and a second plate. The first plate of the feedback capacitor 933 (Cg1) is connected to the input terminal of the inverting amplifier 931. The second plate of the feedback capacitor 933 (Cg1) is connected to the first plate of the additional feedback capacitor 941 (Cg2). The second plate of the additional feedback capacitor 941 (Cg2) is connected to the output terminal of the inverting amplifier 931. The variable feedback capacitor 943 (Cgt) is connected between: i) a node 942 between the feedback capacitor 933 (Cg1) and the additional feedback capacitor 941 (Cg2); and ii) the reference terminal 903. In this way, the variable feedback capacitor 943 (Cgt) can be implemented as a switched capacitor network that has one terminal connected to the reference terminal 903.

In order to get some gain and reduce the noise contribution of the filter, it can be advantageous to place a transconductance amplifier at the input. In examples where the filter is intended for applications where a low supply current is desired, a transconductance amplifier that has a small supply current for a given transconductance while still having an acceptable linearity can be beneficial.

A very good transconductance to supply current ratio can be obtained with open-loop circuits working in weak inversion, such as the spoilt current source transconductance amplifier introduced in M. van de Gevel, J. C. Kuenen, J. Davidse and A. H. M. van Roermund, "Low-power MOS integrated filter with transconductors with spoilt current sources", IEEE Journal of Solid-State Circuits, vol. 32, no. 10, October 1997, pages 1576 . . . 1581.

Figure 10:
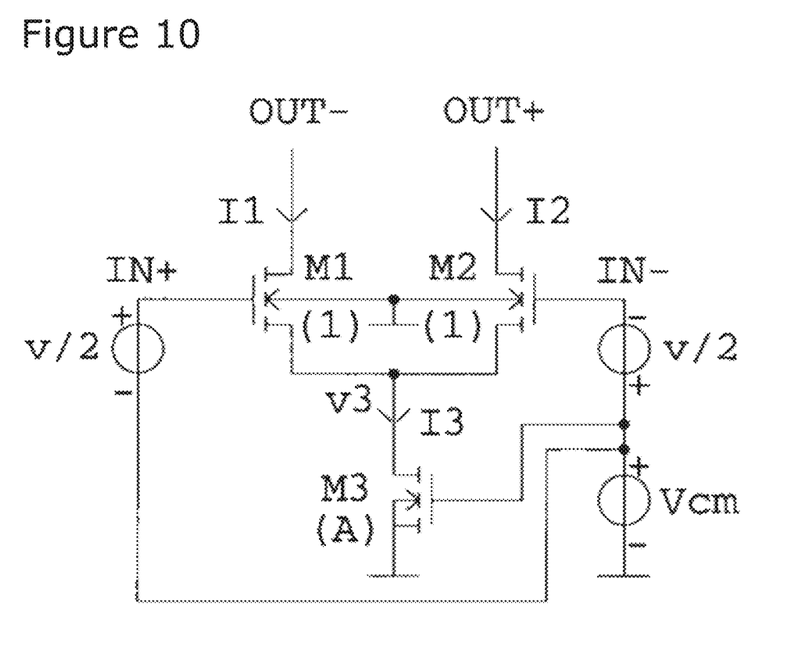
FIG. 10 shows a spoilt current source transconductance amplifier.

FIG. 10 shows the spoilt current source transconductance amplifier from this article. M3 is deliberately biased in the triode region to get distortion compensation. In the article, a PMOS and an NMOS version of this circuit were stacked, doubling the transconductance per unit current and cancelling common-mode output current variations. The same can be done in any of the filters according to this disclosure.

Figure 11:
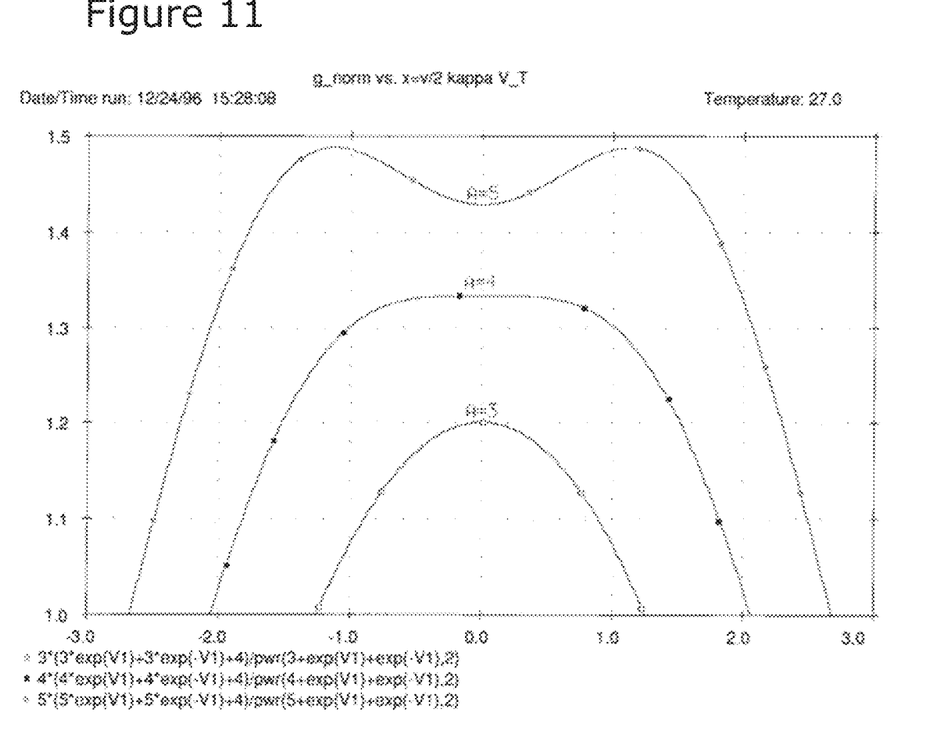
FIG. 11 shows theoretical normalized transconductance versus x for the spoilt current source transconductance amplifier of FIG. 10.

The circuit of FIG. 10 has built-in distortion compensation, but the "linear" range is not very large, as shown in FIG. 11.

FIG. 11 shows theoretical normalized transconductance versus x for the spoilt current source transconductance amplifier of FIG. 10, where x=vin/(2 κ kT/q), where κ is the subthreshold slope factor. A=4 is the maximally flat case, where A is the scaling factor of the spoilt current source.

Theoretically, the transconductance is proportional to $$g_{norm} = A \frac{Ae^x + Ae^{-x} + 4}{(A + e^x + e^{-x})^2} \quad (5)$$

with $x=v_{in}/(2 \kappa KT/q)$, where κ is the subthreshold slope factor. For the maximally-flat case, A=4, the transconductance drops by 1% at x=0.7953655 and by 10% at x=1.516298. Accepting some ripple, A could be increased to 4.5. The transconductance then remains within ±1.25% up to x=1.336554 and is at −10% at x=1.819908.

Figure 12:
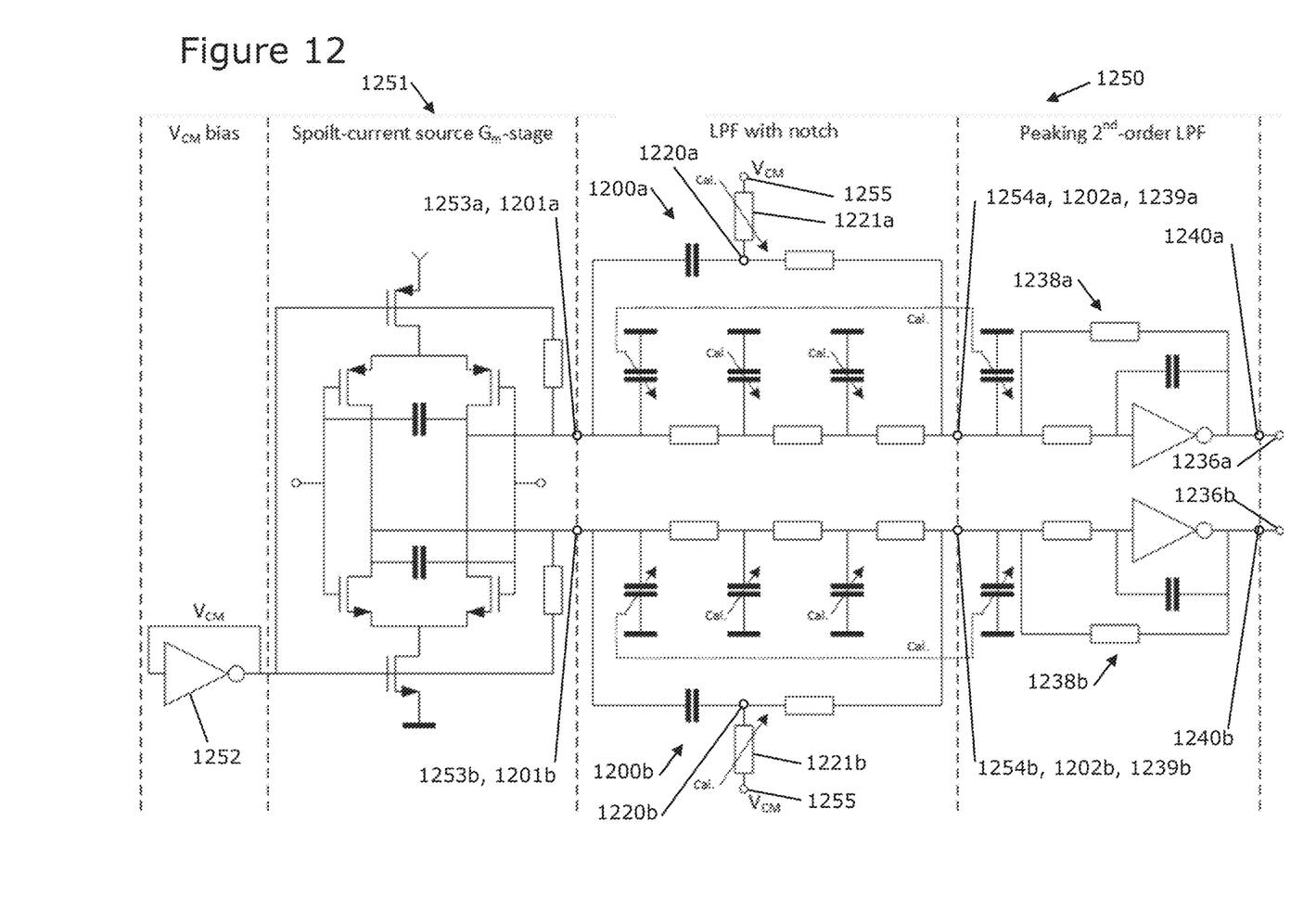
FIG. 12 shows an example embodiment of a differential circuit according to the present disclosure.
Figure 13:
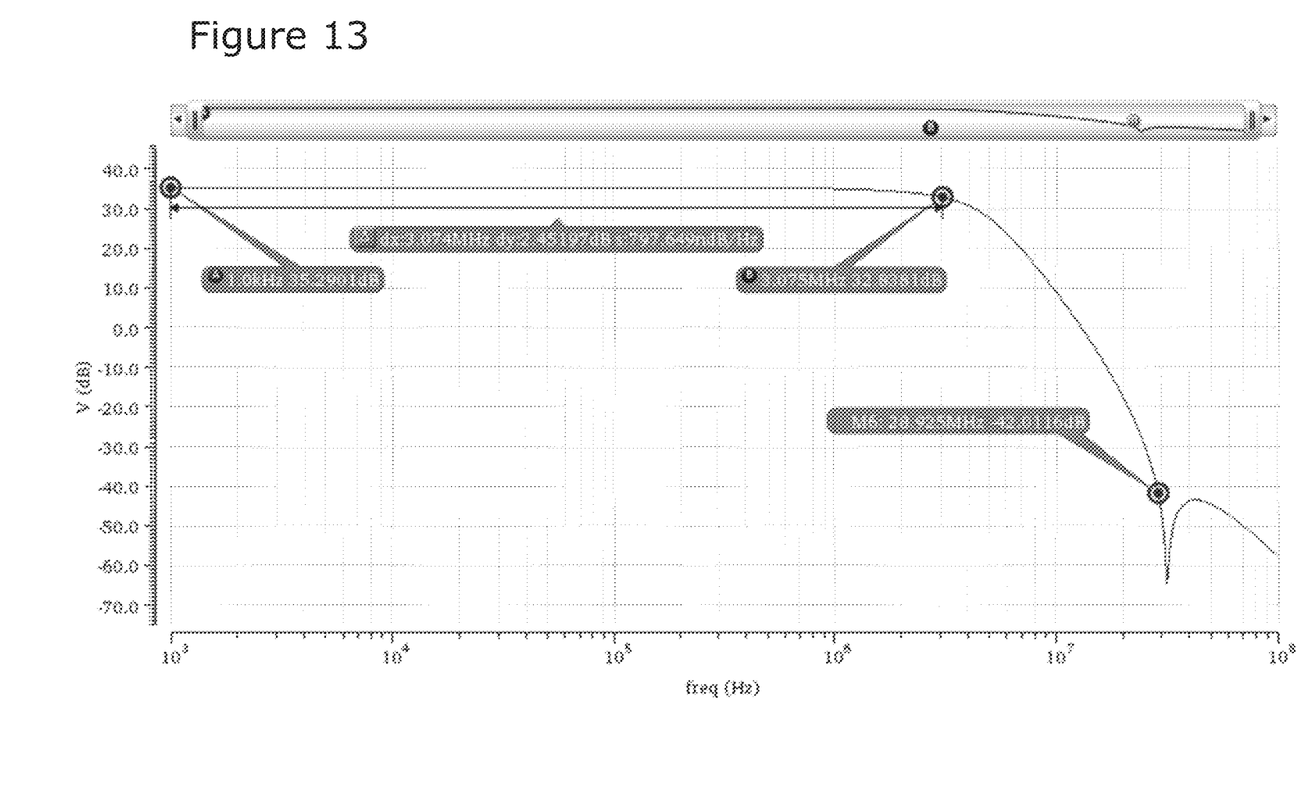
FIG. 13 shows the frequency response of the differential circuit of FIG. 12.

FIG. 12 shows an example embodiment of a differential circuit 1250 according to the present disclosure. The frequency response of the differential circuit 1250 that is shown in FIG. 13, with the notch tuned to 32 MHz. for the intended application of the differential circuit 1250, the passband is up to 3.075 MHz while the sample rate is 32 MHZ, so the oversampling factor is 5.2 and the alias suppression about 75 dB.

The differential circuit 1250 includes a common mode bias voltage source 1252 and a spoilt current source transconductance amplifier ($G_m$) stage 1251. The cross-coupled capacitors in the transconductance amplifier are for neutrodynization, which eliminates Miller effect and reduces the admittance at the transconductance amplifier input, see Louis A. Hazeltine, *Method and electric circuit arrangement for neutralizing capacity coupling*, U.S. Pat. No. 1,450,080, 27 Mar. 1923. As these cross-coupled capacitors are to match the drain-gate capacitances of the transconductance amplifier transistors, they can best be implemented as drain-gate capacitances, for example by adding cross-coupled differential pairs with no tail current.

The differential circuit also includes two low-pass filter circuits 1200a, 1200b (one for each of the two differential signal paths), and two feedback stages 1238a, 1238b (again, one for each of the two differential signal paths).

The differential circuit 1250 includes:
a first differential low-pass filter input terminal 1253a;
a second differential low-pass filter input terminal 1253b;
a first differential low-pass filter output terminal 1254a;
a second differential low-pass filter output terminal 1254b;
a first differential output terminal 1236a;
a second differential output terminal 1236b.

The differential circuit 1250 also includes a first differential low-pass filter circuit 1200a and a second differential low-pass filter circuit 1200b, which can be provided as any of the low-pass filter circuits disclosed herein. The low-pass filter input terminal 1201a of the first differential low-pass filter circuit 1200a is connected to the first differential low-pass filter input terminal 1253a. The low-pass filter output terminal 1202a of the first differential filter circuit 1200a is connected to the first differential low-pass filter output terminal 1254a. The low-pass filter input terminal 1201b of the second differential filter circuit 1200b is connected to the second differential low-pass filter input terminal 1253b. The low-pass filter output terminal 1202b of the second differential filter circuit 1200b is connected to the second differential low-pass filter output terminal 1254b.

Each of the first differential low-pass filter circuit 1200a and the second differential low-pass filter circuit 1200b includes a variable tuning resistor 1221. However, in the differential circuit example, the variable tuning resistors 1221 are is connected between their respective bridging-connection-nodes 1220a, 1220b and a common-mode reference terminal 1255.

The differential circuit 1250 further includes a first feedback stage 1238a and a second feedback stage 1238b.

The first feedback stage 1238a has: a first feedback stage input terminal 1239a, which is connected to the first differential low-pass filter output terminal 1254a; and a first feedback stage output terminal 1240a, which is connected to the first differential output terminal 1236a.

The second feedback stage 1238b has: a second feedback stage input terminal 1239b, which is connected to the second differential low-pass filter output terminal 1254b; and a second feedback stage output terminal 1240b, which is connected to the second differential output terminal 1236b.

Each of the first feedback stage 1238a and the second feedback stage 1238b include the same components that are illustrated in the feedback stage of FIG. 8, and therefore will not be described in detail again here.

Figure 14:
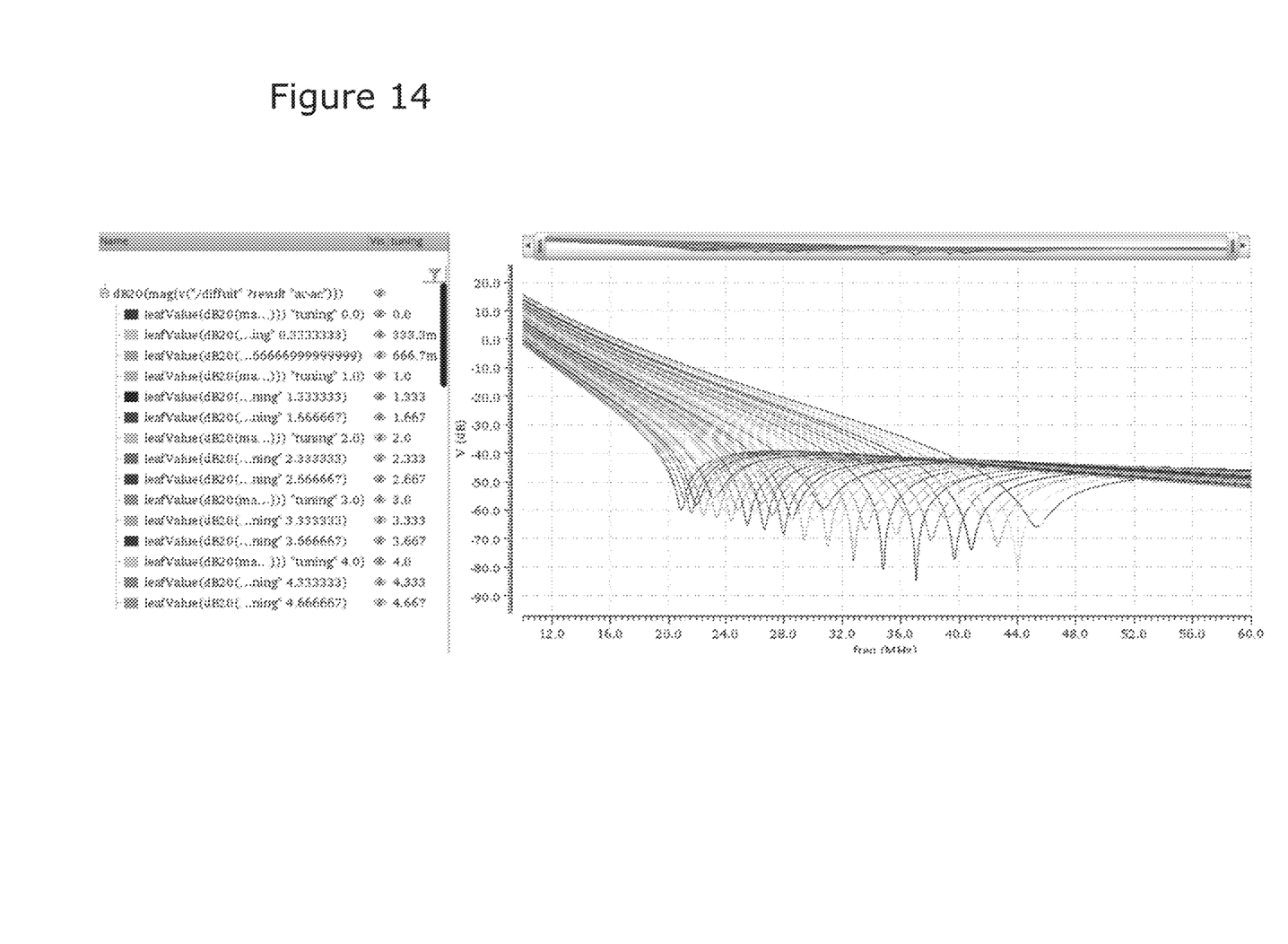
FIG. 14 illustrates the tunability of the notch for the differential circuit of FIG. 12.

FIG. 14 illustrates the tunability of the notch for the differential circuit of FIG. 12. The capacitor banks and the variable tuning resistors each have 16 settings, but intermediate steps can be provided by causing the values of the components to not all change at the same moment. That is, for integer values of tuning, the capacitor banks and variable tuning resistors all have corresponding settings. For integer numbers plus 1/3, the first filter capacitor (Cb) is set one setting higher than the rest; and for integer numbers plus 2/3, the first filter capacitor (Cb) and the second filter capacitor (Cc) are set one setting higher than the rest. Theoretically, a disadvantage is that the suppression in the notch is finite for these intermediate settings, but in practice the notch is still sufficiently deep.

One or more of the circuits that are disclosed herein can be provided on an integrated circuit. Also, one or more of the circuits that are disclosed herein can be provided as part of a Bluetooth receiver circuit.

Circuits that are described herein include an anti-alias filter consisting of a series of two or more passive RC low-pass sections with a parallel path to create a notch around the ADC sample rate, with or without a multiple feedback stage to reduce passband roll-off and to act as an ADC driver. The circuits can also have a transconductance amplifier at the input. Tuning of the notch can be implemented with switchable capacitor and resistor banks. It can be arranged such that all switches have one side connected to ground or to a common-mode voltage. If the switches are made of MOSFETs, this can reduce the switch distortion at a given gate-source overdrive voltage or reduce the required overdrive voltage (and hence the required supply voltage) for a given distortion.

One or more of the following improvements can be achieved when compared with the circuits of FIGS. 2 and 3:
1. Replacing a capacitor that bridges two RC sections with an RC series circuit improves the asymptotic roll-off by one order;
2. Further replacing the resistor in the bridge/branch with a resistive current divider makes the circuit tunable with capacitor and resistor banks that are grounded or connected to a DC voltage on one side; and
3. Adding a peaking multi-feedback (MFB) stage reduces passband roll-off and improves stopband roll-off Example circuits disclosed herein use an RC network to bridge more than one RC low-pass section, using a resistive current divider to tune the capacitive term of the reciprocal of the transadmittance of the bridging section, in order to provide an anti-aliasing filter with as many passive RC circuits as possible, and as few active components as possible, such that an RC notch filter can be applied for anti-aliasing applications.

Circuits in the present disclosure can provide an anti-alias filter for a 5.2 times oversampled ADC for a low-power Bluetooth receiver. Although it will be appreciated that the circuits can be used in any application, especially those where a low-power on-chip anti-alias filter is needed for an oversampled ADC. The circuits could also be used anywhere else where a low-power on-chip low-pass filter is required that needs to have extra suppression in some narrow frequency range, for example because there is a large interfering signal in that frequency range. The use of switches to ground or to a fixed voltage make the circuits especially suitable for low supply voltages.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/ method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A low-pass filter circuit comprising:
a low-pass filter input terminal;
a low-pass filter output terminal;
a reference terminal;
at least three filter resistors connected in series with each other between the low-pass filter input terminal and the low-pass filter output terminal, such that there is a resistor-connecting-node between each adjacent pair of filter resistors;
a plurality of filter capacitors, one for each of the resistor-connecting-nodes, wherein each of the filter capacitors is connected between an associated resistor-connecting-node and the reference terminal; and
a branch connected in parallel with the at least three filter resistors, wherein the branch comprises a bridging capacitor and a bridging resistor in series with each other;
an output capacitor connected between the low-pass filter output terminal and the reference terminal.

2. The low-pass filter circuit of claim 1, further comprising:
an input capacitor connected between the low-pass filter input terminal and the reference terminal.

3. The low-pass filter circuit of claim 1, wherein:
one or more of the filter capacitors comprises a variable capacitor.

4. The low-pass filter circuit of claim 1, wherein:
one or more of the filter capacitors comprises a switchable capacitor bank.

5. The low-pass filter circuit of claim 4, further comprising:

a controller configured to set the capacitance of the one or more switchable capacitor banks based on a desired notch frequency of the circuit.

6. A filter circuit comprising:
a filter circuit input terminal;
a filter circuit intermediate node;
a filter circuit output terminal;
a reference terminal;
a low-pass filter circuit of claim 1, wherein:
  the low-pass filter input terminal is connected to the filter circuit input terminal; and
  the low-pass filter output terminal is connected to the filter circuit intermediate node; and
a feedback stage, wherein the feedback stage comprises:
  a feedback stage input terminal, which is connected to the filter circuit intermediate node;
  a feedback stage output terminal, which is connected to the filter circuit output terminal;
  a feedback stage input resistor comprising a first terminal and a second terminal, wherein the first terminal is connected to the feedback stage input terminal;
  an inverting amplifier having an input terminal and an output terminal, wherein:
    the input terminal of the inverting amplifier is connected to the second terminal of the feedback stage input resistor; and
    the output terminal of the inverting amplifier is connected to the feedback stage output terminal;
  a feedback capacitor connected between the output terminal of the inverting amplifier and the input terminal of the inverting amplifier; and
  a feedback resistor connected between the output terminal of the inverting amplifier and the feedback stage input terminal.

7. The filter circuit of claim 6, wherein:
the feedback capacitor comprises a first plate and a second plate, wherein the first plate is connected to the input terminal of the inverting amplifier;
the feedback stage further comprises:
an additional feedback capacitor having a first plate and a second plate, wherein:
  the first plate of the additional feedback capacitor is connected to the second plate of the feedback capacitor; and
  the second plate of the additional feedback capacitor is connected to the output terminal of the inverting amplifier; and
a variable feedback capacitor, connected between: i) a node between the feedback capacitor and the additional feedback capacitor; and ii) the reference terminal.

8. The filter circuit of claim 7, wherein:
the variable feedback capacitor comprises a switchable capacitor bank.

9. The filter circuit of claim 6, further comprising:
a transconductance amplifier that is configured to provide signalling to the filter circuit input terminal to drive the low-pass filter.

10. A differential circuit comprising:
a first differential low-pass filter input terminal;
a second differential low-pass filter input terminal;
a first differential low-pass filter output terminal;
a second differential low-pass filter output terminal;
a first differential low-pass filter circuit comprising the low-pass filter circuit of claim 1, wherein:
  the low-pass filter input terminal of the first differential low-pass filter circuit is connected to the first differential low-pass filter input terminal; and
  the low-pass filter output terminal of the first differential low-pass filter circuit is connected to the first differential low-pass filter output terminal;
a second differential low-pass filter circuit comprising the low-pass filter circuit of claim 1, wherein:
  the low-pass filter input terminal of the second differential low-pass filter circuit is connected to the second differential low-pass filter input terminal; and
  the low-pass filter output terminal of the second differential low-pass filter circuit is connected to the second differential low-pass filter output terminal.

11. The differential circuit of claim 10, further comprising:
a first differential output terminal;
a second differential output terminal;
a first feedback stage, wherein the first feedback stage comprises:
  a first feedback stage input terminal, which is connected to the first differential low-pass filter output terminal;
  a first feedback stage output terminal, which is connected to the first differential output terminal;
  a first feedback stage input resistor comprising a first terminal and a second terminal, wherein the first terminal is connected to the first feedback stage input terminal;
  a first inverting amplifier having an input terminal and an output terminal, wherein:
    the input terminal of the first inverting amplifier is connected to second terminal of the first feedback stage input resistor; and
    the output terminal of the first inverting amplifier is connected to the first feedback stage output terminal;
  a first feedback capacitor connected between the output terminal of the first inverting amplifier and the input terminal of the first inverting amplifier; and
  a first feedback resistor connected between the output terminal of the first inverting amplifier and the first feedback stage input terminal; and
a second feedback stage, wherein the second feedback stage comprises:
  a second feedback stage input terminal, which is connected to the second differential low-pass filter output terminal;
  a second feedback stage output terminal, which is connected to the second differential output terminal;
  a second feedback stage input resistor comprising a first terminal and a second terminal, wherein the first terminal is connected to the second feedback stage input terminal;
  a second inverting amplifier having an input terminal and an output terminal, wherein:
    the input terminal of the second inverting amplifier is connected to second terminal of the second feedback stage input resistor; and
    the output terminal of the second inverting amplifier is connected to the second feedback stage output terminal;
  a second feedback capacitor connected between the output terminal of the second inverting amplifier and the input terminal of the second inverting amplifier; and a second feedback resistor connected between the output terminal of the second inverting amplifier and the second feedback stage input terminal.

12. A low-pass filter circuit comprising:
a low-pass filter input terminal;
a low-pass filter output terminal;
a reference terminal;
at least three filter resistors connected in series with each other between the low- pass filter input terminal and the low-pass filter output terminal, such that there is a resistor-connecting-node between each adjacent pair of filter resistors;
a plurality of filter capacitors, one for each of the resistor-connecting-nodes, wherein each of the filter capacitors is connected between an associated resistor- connecting-node and the reference terminal; and
a branch connected in parallel with the at least three filter resistors, wherein the branch comprises a bridging capacitor and a bridging resistor in series with each other;
wherein the branch comprises:
a bridging-connection-node between the series connection of the bridging capacitor and the bridging resistor; and
a tuning resistor connected between the bridging-connection-node and the reference terminal, wherein the tuning resistor is a variable resistor.

13. The low-pass filter circuit of claim 12, wherein the tuning resistor comprises a switchable resistor bank.

14. The low-pass filter circuit of claim 12, further comprising a controller configured to provide a control signal for setting the resistance of the tuning resistor based on a desired notch frequency of the circuit.

15. The low-pass filter circuit of claim 12, further comprising:
an input capacitor connected between the low-pass filter input terminal and the reference terminal.

16. The low-pass filter circuit of claim 12, further comprising:
an output capacitor connected between the low-pass filter output terminal and the reference terminal.

17. The low-pass filter circuit of claim 12, wherein:
one or more of the filter capacitors comprises a variable capacitor.

18. The low-pass filter circuit of claim 12, wherein:
one or more of the filter capacitors comprises a switchable capacitor bank.

19. The low-pass filter circuit of claim 18, further comprising:
a controller configured to set the capacitance of the one or more switchable capacitor banks based on a desired notch frequency of the circuit.

* * * * *